United States Patent [19]

Woolf et al.

[11] Patent Number: 5,047,389
[45] Date of Patent: Sep. 10, 1991

[54] SUBSTRATE FOR CERAMIC SUPERCONDUCTOR

[75] Inventors: Lawrence D. Woolf, Carlsbad; Frederick H. Elsner, Cardiff; William A. Raggio, Del Mar, all of Calif.

[73] Assignee: General Atomics, San Diego, Calif.

[21] Appl. No.: 265,827

[22] Filed: Oct. 31, 1988

[51] Int. Cl.$^5$ .............................................. B32B 3/00
[52] U.S. Cl. ...................................... 505/1; 505/701; 505/702; 505/703; 505/704; 428/688; 428/698; 428/699; 428/901; 428/930
[58] Field of Search ........................... 505/1, 701–704; 428/688, 698, 699, 901, 930

[56] References Cited

PUBLICATIONS

"Thermal Spraying Superconducting Oxide Coatings" by Kirkland et al., Advanced Ceramic Materials, vol. 2, No. 3B, Special Issue 1987, pp. 401–410.

"Large Area Plasma Spray Deposited Superconducting $YBa_2Cu_3O_7$ Thick Films" by Cuomo et al., Advanced Ceramic Materials, vol. 2, No. 3B, Special Issue 1987, pp. 422–429.

"High $T_c$ Superconducting Films of Y—Ba—Cu Oxides Prepared by Low—Pressure Plasma Spraying" by Tachikawa et al., Applied Physics Letter 52(12), Mar. 21, 1988, pp. 1011–1013.

"Reaction of $Ba_2YCu_2O_{6.9}$ Films with Yttria-Stabilized Zirconia Substrates" by Cima et al., Applied Physics Letter 53(8), Aug. 22, 1988, pp. 710–712.

"High $T_c$ Superconducting in Y—Ba—Cu—O Screen—Printed Films" by Sacchi et al., Applied Physics Letter 53(12), Sep. 19, 1988, pp. 1110–1112.

"Interdiffusion and Interfacial Reaction Between a $YBa_2Cu_3O_x$ Thin Film and Sustrates" by Nakajima et al., Applied Physics Letter 53(15), Oct. 10, 1988, pp. 1437–1439.

"Lanthanum Gallate Substrates for Epitaxial High-Temperature Superconducting Thin Films" by Sandstrom et al., Applied Physics Letter 53(19), Nov. 7, 1988, pp. 1874–1876.

"Processing Techniques for the 93 K Superconductor $Ba_2YCu_3O_7$" by Murphy et al., Science, vol. 241, Aug. 19, 1988, pp. 922–930.

"On the New Substrate Materials for High $T_c$ Superconducting Ba—Y—Cu—O Thin Films" by Komatsu et al., Japanese Journal of Applied Physics, vol. 27, No. 9, Sep. 1988, pp. L1686–L1689.

JA 89-245979/34; Sumitomo Elec.; 1-11-88.

Primary Examiner—Patrick J. Ryan
Attorney, Agent, or Firm—Nydegger & Associates

[57] ABSTRACT

A substrate for supporting a ceramic superconductor comprises a metallic base member having a constituent oxide former which establishes an oxide layer on the surface of the substrate. A layer of ceramic superconducting material covers the substrate with the oxide layer between the metallic base member and the ceramic superconductor layer to inhibit the interdiffusion of respective constituent elements between the metallic base member and the ceramic layer. For applications requiring the transmission of electrical current through the ceramic layer over relatively extensive distances, the substrate can be formed as a wire.

14 Claims, 1 Drawing Sheet

SUBSTRATE FOR CERAMIC SUPERCONDUCTOR

BACKGROUND OF THE INVENTION

This invention relates generally to apparatus and systems for employing ceramic superconductors. More particularly, this invention relates to a metallic substrate which supports the ceramic superconductor and has a protective oxide barrier on its surface that inhibits interdiffusion of constituent elements between the substrate and the ceramic superconductor. The present invention is particularly, but not exclusively, useful as a wire substrate that effectively supports a ceramic superconductor coating.

DISCUSSION OF THE FIELD OF THE INVENTION

It is well known that certain ceramics have unique characteristics and properties which make them extremely well suited for a wide range of specific applications. Indeed, many additional applications for these so-called ceramic superconductors are still being determined. Ceramic superconductors, however, are quite fragile and can be easily damaged. Thus, to a very great extent, the effectiveness of any particular application for the superconductor depends on the ability to establish a platform which will support the ceramic superconductor for its intended purpose.

Based on the need to provide a ceramic superconductor having very precise operating characteristics, a platform or substrate which will provide the necessary mechanical stability for the ceramic superconductor should also satisfy other criteria. Most importantly, there needs to be chemical compatibility between the substrate and the superconducting material that is used to make the ceramic. This is so in order to avoid the potential for interdiffusion of respective constituent elements between the substrate and the ceramic superconductor which would otherwise occur. On the one hand, without chemical compatibility, the diffusion of constituent elements from the substrate into the ceramic superconductor will dope the superconductor with foreign elements which invariably poison the superconductor by lowering its critical temperature ($T_c$) and reducing its critical current density ($J_c$). On the other hand, the diffusion of constituent elements from the ceramic superconductor into the substrate will change the desirable characteristics of the substrate, e.g. embrittle the substrate. Furthermore, this diffusion will also deplete the ceramic superconductor of its constituent elements and thereby aggravate the depression of the superconductor's $T_c$ and $J_c$.

In addition to being chemically compatible with the supported ceramic superconductor, the substrate should preferably cause the ceramic to be in a state of compression rather than a state of tension. This is so because ceramic superconductors can withstand significantly greater compressive forces than they can tensile forces. One way to accomplish this is to use a substrate which has an equal or slightly higher coefficient of thermal expansion than does the ceramic superconductor. With this difference in the respective coefficients of thermal expansion, the substrate will tend to urge the coating of ceramic superconductor into a state of compression as the combination of substrate and superconductor cools to operating temperatures from the elevated temperatures that are necessary to sinter grains of superconducting material into a ceramic. Consequently, the propensity of the combination will be to compress the ceramic superconductor and avoid a state of tension in which the ceramic is more susceptible to damage.

It is also desirable that the ceramic superconductor substrate be easily manufactured. Indeed, it is preferable if the substrate is commercially available. Additionally, it is desirable that the substrate material be able to maintain its strength at the high temperatures it will be subjected to during fabrication of the superconductor (i.e. 800° C. to 1000° C.). Further, it is desirable that the substrate material be sufficiently ductile to allow drawing of the material into a very thin wire.

The present invention recognizes that commercially available materials, in various configurations, can be treated to create a suitable substrate for a ceramic superconductor. Specifically, the present invention recognizes that various commercially available materials can be processed to create a barrier or interaction zone between the underlying substrate and the ceramic superconductor layer which will inhibit the interdiffusion of constituent elements between the substrate and the ceramic superconductor layer it is supporting.

In light of the above, it is an object of the present invention to provide a substrate for a layer or coating of ceramic superconducting material which is chemically compatible with the ceramic material in order to inhibit interdiffusion therebetween. Another object of the present invention is to provide a substrate for a layer or coating of ceramic superconducting material which causes the ceramic material to compress in order to provide additional protection for the integrity of the ceramic. Still another object of the present invention is to provide a substrate for a layer or coating of ceramic superconducting material which provides sufficient mechanical stability for the ceramic during its fabrication and operation. Yet another object of the present invention is to provide a ceramic superconductor substrate which is relatively easy to manufacture and comparatively cost effective.

SUMMARY OF THE INVENTION

The preferred embodiment of the novel substrate for supporting a ceramic superconductor in accordance with the present invention comprises a metallic substrate which includes a protective oxide former as a constituent element. Processing the substrate under prescribed conditions causes a protective oxide layer to be formed on the surface of the substrate which bonds with the ceramic superconductor that is supported by the substrate. In its position between the substrate and the ceramic superconductor layer, this oxide layer helps establish a barrier or interaction zone which substantially inhibits any interdiffusion of constituent elements between the ceramic superconductor and the substrate.

In accordance with the present invention, the substrate can be of any configuration. Preferably, however, the substrate is a wire for those applications in which the ceramic superconductor coating on the substrate is to be used as a very low resistance electrical conductor. Further, it is preferable that the active oxide formers in the substrate constitute approximately one to ten percent (1–10%) of the substrate's weight and be from the group which includes aluminum (Al), silicon (Si), manganese (Mn), magnesium (Mg) and zirconium (Zr). These particular protective oxide formers are able to establish an oxide layer on the surface of the substrate that is efficacious for creating an interaction zone between the substrate and the ceramic superconductor which will inhibit interdiffusion therebetween.

As contemplated by the present invention, the combination of substrate, interaction zone and ceramic superconductor layer can be manufactured in any of several ways. Specifically, the layer of ceramic superconducting material can be placed onto the substrate by either coating the substrate with a solution containing the elements of the superconductor material, or by directly depositing grains of the superconductor on the substrate. The coated substrate is then placed into an oxidizing environment and heated to a temperature which will cause some of the oxide forming elements in the substrate to migrate to the surface of the substrate where they are oxidized to form the oxide layer. The temperature of the coated substrate is then further elevated to a level where the grains of superconducting material sinter to form a ceramic that bonds to the oxide layers. In an alternate procedure a substrate, which may or may not be already formed with an oxide layer, is placed into an environment where a superconducting material can be vapor deposited on the substrate.

The novel features of this invention, as well as the invention itself, both as to its structure and its operation, will be best understood from the accompanying drawings, taken in conjunction with the accompanying description, in which similar reference characters refer to similar parts, and in which:

DESCRIPTION OF THE PREFERRED EMBODIMENT

Figure 1:
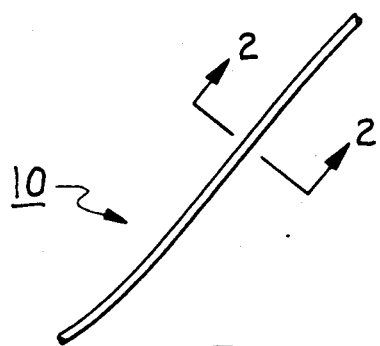
FIG. 1 is a perspective view of a ceramic superconductor coated wire.
Figure 2:
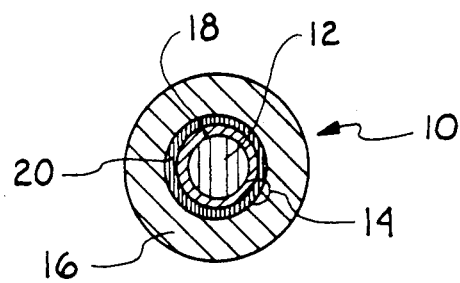
FIG. 2 is an enlarged cross-sectional view of the coated wire as seen along the line 2—2 in FIG. 1.

Referring initially to FIG. 1, it will be seen that the present invention can be configured as a wire, generally designated 10. In FIG. 2, it will be seen that the wire 10 essentially comprises a substrate 12, an interaction zone 14 and a layer 16 of ceramic superconducting material. Further, it is to be appreciated that interaction zone 14 itself comprises an oxide layer 18 which is formed on the surface of substrate 12 and an interface layer 20 which is formed between oxide layer 18 and ceramic superconductor layer 16. When the present invention is configured as wire 10, substrate 12 is essentially an elongated cylindrical-shaped base member and interaction zone 14 is established as a layer on the surface of substrate 12 in accordance with procedures to be subsequently disclosed. Ceramic superconductor layer 16 completely covers interaction zone 14 to establish a wire 10 in which substrate 12, interaction zone 14 and ceramic layer 16 are substantially concentric. As will be appreciated by the skilled artisan, the cooperation of these components of wire 10 is crucial to its efficacy. Accordingly, each component must be considered in light of its effect on the combination.

Substrate 12 needs to be selected with certain characteristics in mind. First, substrate 12 must be able to provide an effective mechanical support for ceramic superconductor layer 16. Second, it should not chemically interact with the ceramic superconductor layer 16 in any way which will "poison" the ceramic layer 16 and thereby reduce its efficacy.

With regard to the need that substrate 12 provide an effective support for ceramic layer 16, it will be appreciated by the skilled artisan that most metallic substances can be configured to satisfy this requirement. Due to the typically fragile nature of ceramic layer 16, however, it is desirable that substrate 12 be able to impose axial compressive stresses on ceramic layer 16 in addition to providing structural support for the layer 16. This particular capability is necessary because it is known that ceramics are generally able to withstand greater compressive stresses than tensile stresses before they crack. It happens that, since ceramic layer 16 is sintered onto substrate 12 at much higher temperatures than the operating temperatures of wire 10, the desired situation between substrate 12 and layer 16 can be created if substrate 12 is selected to have a slightly higher coefficient of thermal expansion than that for ceramic layer 16. With this relationship, substrate 12 will impose a force on ceramic layer 16 at the operating temperatures of wire 10 which will urge ceramic layer 16 toward an axially compressive state.

Importantly, some mechanism is required for wire 10 which chemically isolates substrate 12 from ceramic superconductor layer 16. This is needed so that the ceramic layer 16 is not poisoned and the substrate 12 is not compromised. In accordance with the present invention, this isolation is accomplished by interaction zone 14. As stated above, interaction zone 14 has a protective oxide layer 18. Preferably, this protective oxide layer 18 can be formed on the surface of substrate 12 by heating substrate 12 to temperatures in the range of 800° C. to 900° C. and maintaining this temperature for approximately one to ten hours. This, of course, presupposes that substrate 12 contains appropriate oxide formers which will establish the protective oxide layer 18 of interaction zone 14. Preferably, such an oxide former comes from the group which includes aluminum (Al), silicon (Si) magnesium (Mg), Zirconium (Zr) and manganese (Mn) since wires which contain these elements are commercially available. Also, these elements are particularly good because it is known that they will migrate to the surface 18 of substrate 12 more quickly than other constituent elements in the substrate 12. The result is that an oxide of these elements is formed as a layer on substrate 12. As shown in FIG. 2, this oxide layer 18 will form the part of interaction zone 14 which is adjacent substrate 12.

Several commercially available products, which are set forth below in Table 1 exhibit the desirable characteristics for substrate 12 to varying degrees.

TABLE 1

| COMPOSITION OF WIRE SUBSTRATES (WEIGHT %) | | | | | | | |
|---|---|---|---|---|---|---|---|
| | Ni | Fe | Cr | Al | Si | Mn | Mg |
| Hoskins 875 | | 71 | 23 | 5.5 | | | |
| Alumel | 94.8 | | | 1.5 | 1.5 | 1.7 | |
| Inconel 601 | 60 | 13 | 23 | 1.5 | 0.5 | 1.0 | |
| Haynes 214 | 76.5 | 3 | 16 | 4.5 | | | |
| Nisil | 95.5 | | | | 4.4 | | 0.1 |
| Nicrosil | 84.4 | | 14.2 | | 1.4 | | |
| Ni$_3$Al | 86.7 | | 13.3 | | | | |

Specifically, from the products listed in Table 1, Hoskins 875 is preferred because it generates an oxide layer 18 of alumina ($Al_2O_3$) as part of interaction zone 14 which is particularly effective for inhibiting the diffusion of other constituent elements from substrate 12. Equally important, as will become more apparent after further disclosure, the alumina layer is also very effective for inhibiting the diffusion of constituent elements from ceramic superconductor layer 16 into substrate 12. While Hoskins 875 has been suggested here as a preferred substrate 12, this is not done with the suggestion that the other listed products are less effective. Indeed, the efficacy of any particular substrate will depend on its intended application.

Preferably, ceramic layer 16 comprises a well known superconductor having constituent elements which include a rare earth (RE) together with barium (Ba), Copper (Cu) and Oxygen (O). Typically, this superconductor is designated RE $Ba_2Cu_3O_{7-x}$ and is familiarly referred to as 1-2-3. It is to be understood, however, that other known superconductors can be used without departing from the spirit or intent of the present invention. For example, a bismuth (Bi) or thallium (Tl) based superconductor can also be used.

Figure 3:
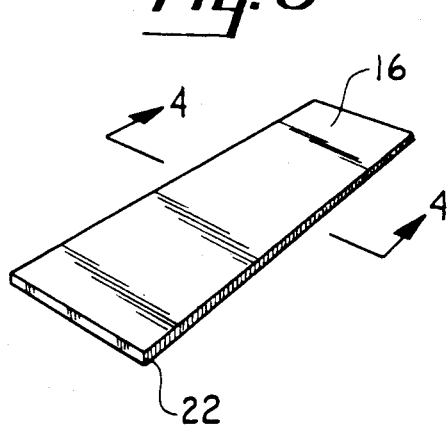
FIG. 3 is a perspective view of a ceramic superconductor coated plate or ribbon.
Figure 4:
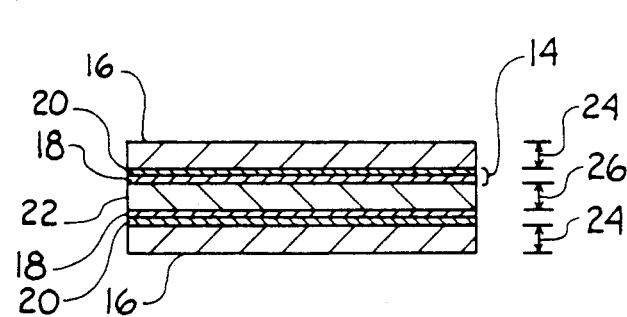
FIG. 4 is a cross-sectional view of the coated plate as seen along the line 4-4 in FIG. 3.

As shown in FIG. 3, the ceramic superconducting layer 16 may also be bonded to a substrate 22 which is configured as a ribbon, a plate or some other structure having a flat surface. Further, as shown in FIG. 4, substrate 22 can have superconductor layers 16 bonded on either side thereof. More specifically, FIG. 4 shows that substrate 22 is formed with an oxide layer 18 in an interaction zone 14 on one side of substrate 20 and that another oxide layer in an interaction zone 14 is formed on its opposite side. With interaction zones 14 established as shown in FIG. 4, ceramic superconductor layer 16 may be bonded thereon similarly to that for layer 16 and substrate 12 of wire 10. Thus, regardless whether substrate 12 or 22 is used, the general relationships between the substrates 12 or 22, interaction zones 14 and the ceramic superconductor layers 16 will remain structurally and chemically the same.

In order to appreciate the relative dimensions of the present invention, for a typical superconductor the depth 24 of ceramic superconductor layer 16 is on the order of approximately seventy-five (75) microns whereas the depth 26 of substrate 22 is on the order of approximately fifty (50) microns. The depth of interaction zone 14 therebetween will typically be on the order of five (5) to ten (10) microns. It is noted that these same relative dimensions are also applicable for wire 10 as shown in FIG. 2. Specifically, the diameter of substrate 12 will be on the order of fifty (50) microns, the thickness of interaction zone 14 will be on the order of five (5) to ten (10) microns and the thickness of ceramic superconductor layer 16 on the order of seventy-five (75) microns.

It is of interest that during the sintering of ceramic superconductor layer 16, there will be some reaction between the superconducting material in layer 16 and the oxide layer 18 which creates interface layer 20 between layer 16 and the substrate 12. Specifically, in the case where Hoskins 875 is used as substrates 12, 22, a very small amount of Barium (Ba) and Copper (Cu) will be depleted from the 1-2-3 material during sintering of layer 16 and will react with the alumina ($Al_2O_3$) of oxide layer 18 to form an interface layer 20 which may contain Barium aluminate ($BaAl_2O_4$). In most cases this interaction is relatively minor and has minimal, if any, effect on the efficacy of the wire 10. Importantly, however, the interface layer 20 should be relatively small compared to the ceramic superconductor layer 16. This is so primarily in order to minimize the depletion of barium (Ba) from ceramic layer 16.

Figure 5:
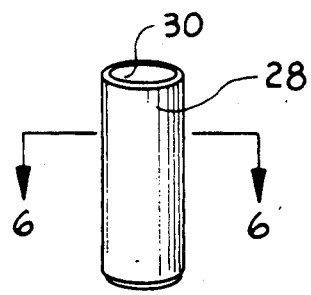
FIG. 5 is a perspective view of a ceramic superconductor coated hollow cylinder.
Figure 6:
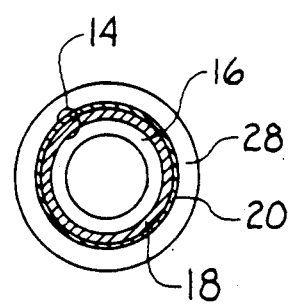
FIG. 6 is a cross-sectional view of the coated hollow cylinder as seen along the line 6—6 in FIG. 5.

FIG. 5 shows that the invention is also applicable in situations where a substrate 28 is configured as a hollow cylinder. With such a substrate it is possible to coat the inner surface 30 of substrate 28 as shown in FIG. 6. It will be easily appreciated by the skilled artisan that the exterior surface of a substrate 30 could be coated in a like manner similar to that shown for substrate 22 in FIG. 4.

While substrate configurations in the form of a wire (FIG. 1), a plate or ribbon (FIG. 2) and a hollow cylinder (FIG. 5) have been shown for the present invention, these configurations are intended to be only exemplary. It is to be appreciated by the skilled artisan that substrates of various configurations are suitable for use with the present invention and are determined only by the specific requirements of the application.

METHOD OF MANUFACTURE

In the contemplation of the present invention, the ceramic superconductor layer 16 can be bonded to a substrate in any of several ways all known in the pertinent art. For purposes of discussion, a substrate 12 will be considered with a view toward the manufacture of a superconductor wire 10.

It is to be appreciated that the actual coating of a superconducting material such as 1-2-3 onto substrate 12 is accomplished by covering the entire surface of substrate 12. This can be done with a solution in which superconducting material is dissolved. Further, grains of superconducting material can be deposited directly onto the substrate 12 in any of several ways known in the pertinent art, such as by slurry coating or by electrophoresis. The coated substrate 12 is then placed into an oxidizing environment and heated to a temperature in the range of 800° C. to 900° C. for the purpose of forming oxide layer 14. As mentioned earlier, it happens that in this particular environment, the protective oxide formers in substrate 12 will migrate to the surface 18 of substrate 12 much more rapidly than other constituents of the substrate 12. In the oxidizing environment, these oxide formers then establish the oxide layer 18 which is useful for subsequently inhibiting the interdiffusion of respective constituent elements between substrate 12 and ceramic superconductor layer 16. During this process, it is preferred that the temperature of substrate 12 in the oxidizing environment be maintained in the range 80° C. to 900° C. for approximately one to ten hours. The oxidized substrate 12 and grains of superconducting material on oxide layer 18 may then be elevated in temperature into the range of approximately 900° C. to 980° C. to sinter the grains of superconducting material. This sintering process requires maintenance of temperatures in the range of approximately 900° C. to 980° C. for approximately four hours. During this sintering process, the superconducting elements react with oxide layer 18 to create interface layer 20 on which ceramic layer 16 is being formed. A superconductor wire 10 has thus been formed. It is interesting to note that, prior to the sintering step, the unsintered grains of superconducting material present a porous region through which oxygen can penetrate to contact substrate 12 during the forming of oxide layer 18. This is so regardless whether grains of superconducting material have been deposited directly onto the surface of substrate 12 or have been coated onto the surface of substrate 12 in solution.

In the case where superconducting material is to be vapor deposited onto substrate 12, it may be necessary that substrate 12 be preoxidized. This is done by placing an uncoated substrate 12 in an oxidizing environment at temperatures in the range of approximately 800° C. to 900° C. As before, these temperatures are maintained for approximately one to ten hours. This will cause the oxide layer 18 to form on the surface of substrate 12 and this preoxidized substrate 12 may then be subjected to any process well known in the pertinent art, such as by sputtering, evaporation, or chemical vapor deposition, which will vapor deposit superconducting material onto oxide layer 18.

Further protection of the superconductors fabricated in accordance with the present invention can be obtained by coating the conductor with silver (Ag). Additionally, this silver coating (not shown) will be helpful in applications where it is necessary to facilitate electrical contact with the ceramic superconductor layer 16.

Under any of the above-described procedures, it is necessary that the step of forming the oxide layer on substrate 12 can be continued for a period of time which is sufficient to allow stabilization of the oxide on surface 18 of substrate 12. The examples given above indicate this procedure should be continued for approximately one to ten hours. If oxide stabilization does not occur, the very purpose of the oxide layer will be compromised. This is crucial because it is of utmost importance to the present invention that oxide layer 14 be established between substrate 12 and ceramic superconductor layer 16 for the purpose of inhibiting interdiffusion of constituent elements between substrate 12 and ceramic superconductor layer 16.

While the particular substrate for supporting a ceramic superconductor as herein shown and disclosed in detail is fully capable of obtaining the objects and providing the advantages herein before stated, it is to be understood that it is merely illustrative of the presently preferred embodiments of the invention and that no limitations are intended to the details of construction or design herein shown other than as defined in the appended claims.

We claim:

1. A structure for supporting a ceramic superconducting material having oxygen and copper constituents, which comprises:
    a metallic substrate having an oxide former constituent; and
    an oxide layer formed by said oxide former on the surface of said substrate to substantially inhibit interdiffusion between said substrate and said ceramic superconducting material when said ceramic material is bonded to said substrate, wherein said oxide former is a material selected from the group consisting of aluminum (Al), silicon (Si), manganese (Mn), magnesium (Mg), zirconium (Zr), and combinations thereof.

2. A structure for supporting a ceramic superconducting material as recited in claim 1 further comprising an interface layer between said oxide layer and said ceramic to establish an interaction zone comprising said oxide layer and said interface layer between said ceramic superconducting material and said substrate.

3. A structure for supporting a ceramic superconducting material as recited in claim 2 wherein said interaction zone is greater than approximately five microns in depth and said layer of ceramic superconducting material is greater than approximately fifty microns in depth.

4. A structure for supporting a ceramic superconducting material as recited in claim 3 wherein said substrate is an elongated substantially cylindrical shaped wire.

5. A structure for supporting a ceramic superconducting material as recited in claim 4 wherein said oxide layer is concentric with said substrate and said ceramic superconducting material is formed as a layer concentric with said oxide layer.

6. A structure for supporting a ceramic superconducting material as recited in claim 5 wherein said oxide former is aluminum.

7. A structure for supporting a ceramic superconducting material as recited in claim 5 wherein said oxide former is silicon.

8. A structure for supporting a ceramic superconducting material as recited in claim 5 wherein said oxide former is manganese.

9. A structure for supporting a ceramic superconducting material as recited in claim 5 wherein said oxide former is magnesium.

10. A structure for supporting a ceramic superconducting material as recited in claim 5 wherein said oxide former is zirconium.

11. A structure for supporting a ceramic superconducting material as recited in claim 5 wherein said ceramic superconducting material is RE $Ba_2Cu_3O_{7-x}$.

12. A structure for supporting a ceramic superconducting material as recited in claim 11 wherein said substrate comprises iron, chromium and aluminum.

13. A structure for supporting a ceramic superconducting material as recited in claim 11 wherein said substrate comprises nickel, aluminum, silicon and manganese.

14. A structure for supporting a ceramic superconducting material as recited in claim 11 wherein said substrate comprises nickel, chromium, and silicon.

* * * * *

UNITED STATES PATENT AND TRADEMARK OFFICE
CERTIFICATE OF CORRECTION

PATENT NO. : 5,047,389

DATED : September 10, 1991

INVENTOR(S) : Woolf, et al.

It is certified that error appears in the above-identified patent and that said Letters Patent is hereby corrected as shown below:

On the patent Cover Page, in the listing of Inventors, after "William A. Raggio, Del Mar" insert --; Tihiro Ohkawa, La Jolla; W. Robert Johnson, San Diego--.

Signed and Sealed this

Twenty-third Day of November, 1993

Attest:

BRUCE LEHMAN

Attesting Officer     Commissioner of Patents and Trademarks